United States Patent [19]
Gaarder

[11] Patent Number: 6,137,508
[45] Date of Patent: Oct. 24, 2000

[54] PRINTHEAD DE-MULTIPLEXING AND INTERCONNECT ON CARRIAGE MOUNTED FLEX CIRCUIT

[75] Inventor: Glenn Gaarder, Ramona, Calif.

[73] Assignee: Hewlett-Packard Company, Palo Alto, Calif.

[21] Appl. No.: 09/245,118

[22] Filed: Feb. 4, 1999

[51] Int. Cl.[7] ....................................................... B41J 2/14
[52] U.S. Cl. .................................................. 347/50; 347/40
[58] Field of Search ................................. 347/50, 40, 42

[56] References Cited

U.S. PATENT DOCUMENTS 5,469,199  11/1995  Allen et al. ................................ 347/42
5,861,899  1/1999  Nguyen et al. ............................ 347/40

*Primary Examiner*—N. Le
*Assistant Examiner*—Shih-wen Hsieh

[57] ABSTRACT

A flexible printhead signal de-multiplexing and interconnect circuit for mounting on the carriage of an inkjet printer receives multiplexed signals through a carriage trailing cable and includes signal de-multiplexers and other circuitry for de-multiplexing the control signals on the printhead carriage. A flexible circuit forms a generally three-sided channel configuration including side or wing panels which may have portions folded back on themselves to provide additional areas for connection of additional circuit components and enclosing the additional circuit components if desired. Electrical connections are also provided for an optical position encoder.

14 Claims, 5 Drawing Sheets

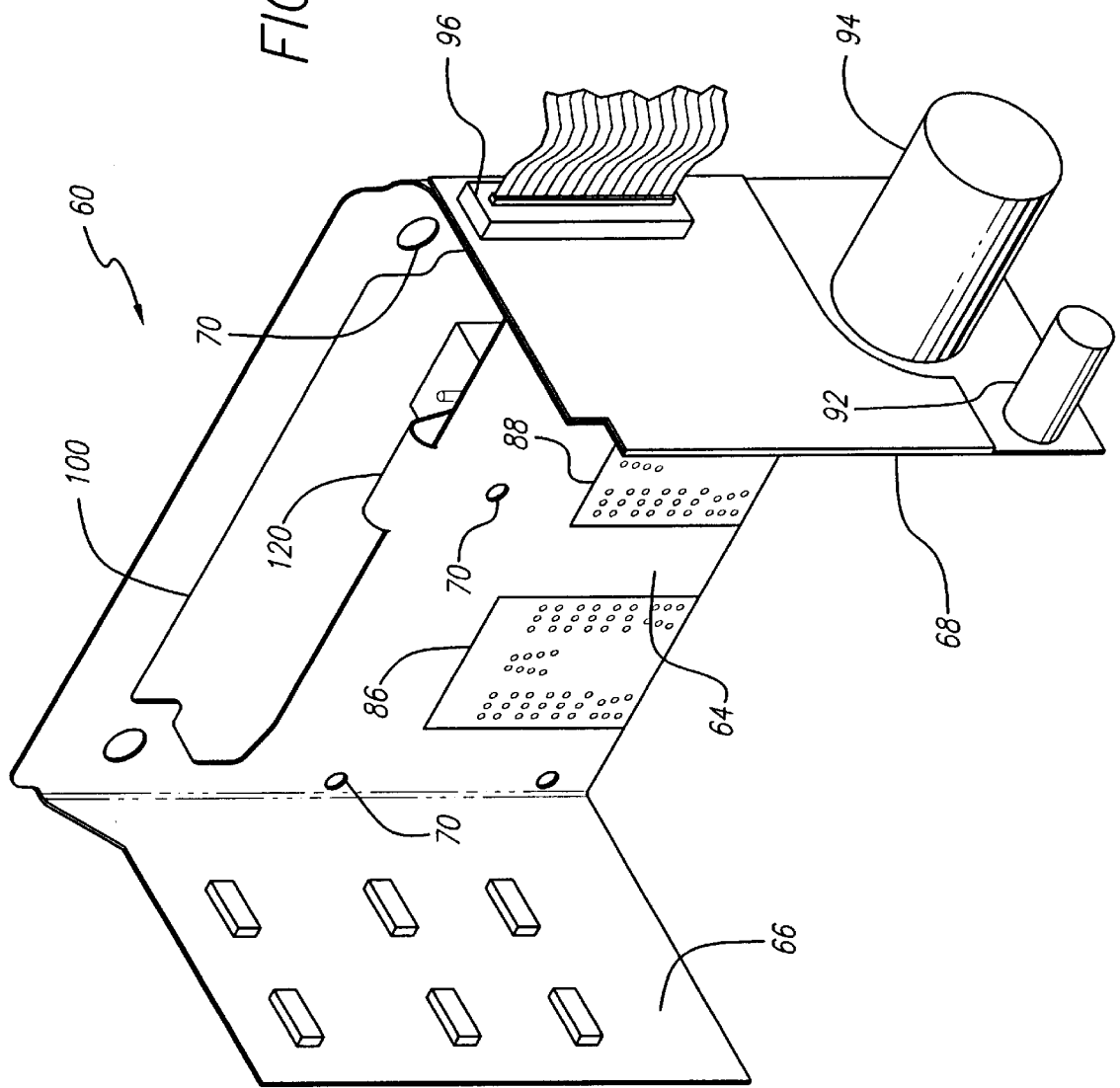

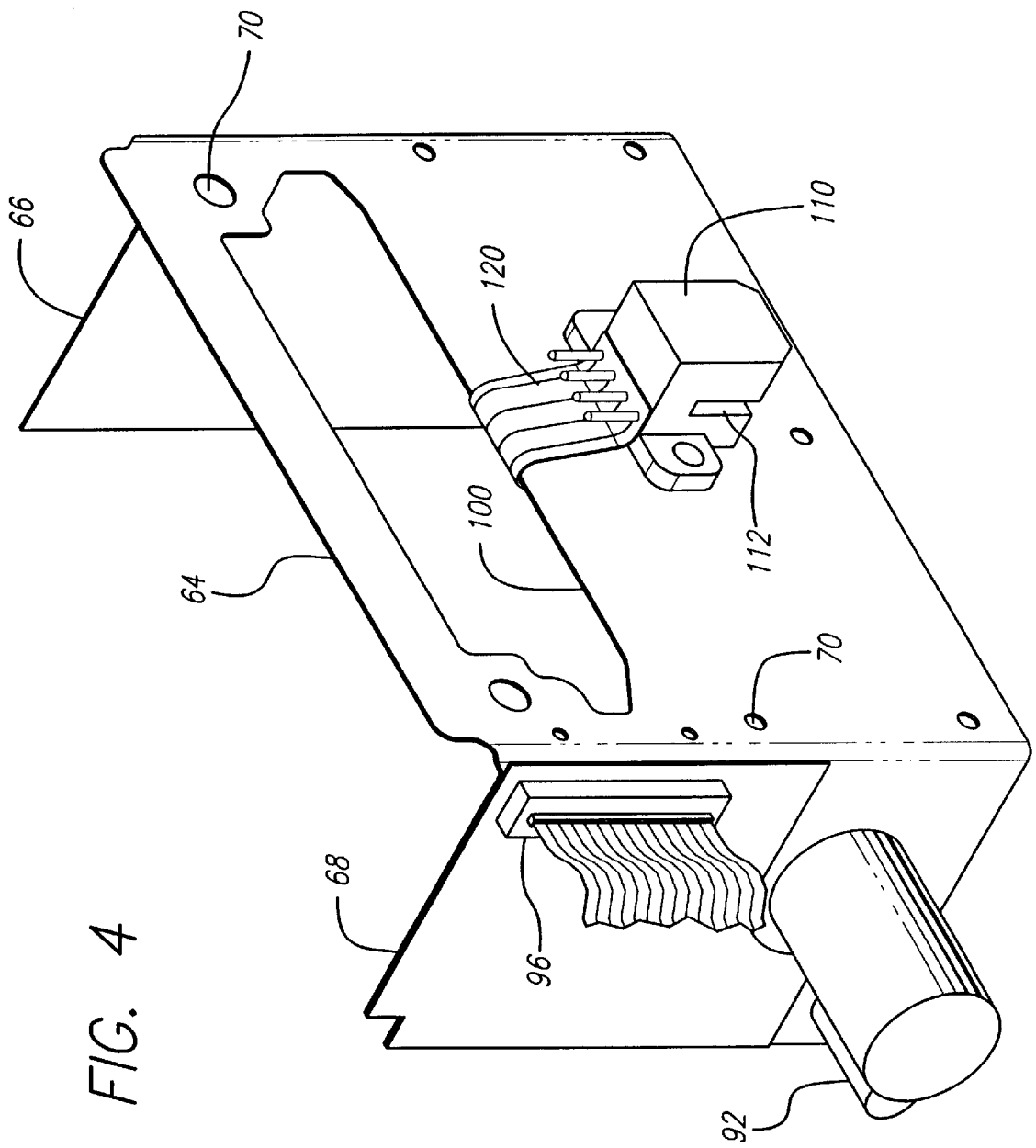

PRINTHEAD DE-MULTIPLEXING AND INTERCONNECT ON CARRIAGE MOUNTED FLEX CIRCUIT

CROSS REFERENCE TO RELATED APPLICATIONS, IF ANY

None.

BACKGROUND OF THE INVENTION AND PRIOR ART

The present invention relates to the art of computer driven printers, particularly color ink jet printers. Printers of this type have a printhead carriage which is mounted for reciprocal movement on the printer in a direction orthogonal to the direction of movement of the paper or other medium on which printing is to take place through the printer. The printer carriage of a color printer typically has a black ink and one or more color thermal ink jet printheads removably mounted thereon.

Provision must be made for transmitting printhead control signals and printhead position data to and from the moveable carriage. Two methods are presently used. The first method uses a rigid printed circuit board mounted on the carriage structure which receives multiplexed signals transmitted by a carriage trailing cable from the main logic board. The rigid PCB includes demultiplexing circuitry which then transmits the demultiplexed signals to a separate printhead interconnect which may be either (a) a separate flex circuit with compliant dimple contacts that interconnect with the thermal ink jet printheads or (b) a module that mounts on the carriage mounted PCB that consists of spring loaded plungers that engage the thermal ink jet cartridges. The rigid carriage borne PCB and separate flex circuit or module are expensive options that consume valuable space and mass which should be minimized on the moveable carriage.

The second method uses flexible cables extending from a printed circuit board mounted in a remote stationary position on the printer to the printhead carriage and transmit de-multiplexed signals to the carriage, the de-multiplexing circuitry being positioned on the printed circuit board. Apart from the fact that a considerably large number of individual conductors are required in the trailing cable when de-multiplexed signals are to be conducted thereby, the currently used de-multiplexed signal transmitting trailing cables comprise two separate superimposed layers which respectively transmit de-multiplexed signals to the black ink jet printhead and to the color printhead. In order to connect the various conductors of the two layers to the printed circuit board, four separate cable connectors are employed thus requiring the two superimposed layers of the cable each to be split at the PCB connection end into two separate spaced parallel sections. Fabrication of these trailing cables for transmitting de-multiplexed signals to the carriage is extremely expensive due to the large number of conductors required (typically 120) and the amount of unusable areas on a standard rectangular circuit fabrication layout.

The present invention provides a printhead de-multiplexing and interconnect carriage mounted flex circuit comprising:

a) a flexible multi-conductor carrying insulating panel foldable into a generally three sided configuration for attachment to a relatively rigid printhead carriage for conducting multiplexed electrical control signals to printheads mounted on and moveable with the printhead carriage, some conductors in said panel terminating in printhead electrical contacts on a surface thereof;

b) a cable connecter on said panel in electrical contact with said conductors for connecting said flex circuit to a printhead trailing cable which extends to a remote location from which multiplexed printhead control signals are transmitted to said flex circuit; and c) at least one printhead control signal de-multiplexer components mounted on said flexible panel in electrical contact with at least some of said conductors.

BRIEF DESCRIPTION OF THE DRAWINGS

FIG. 3 is a front perspective view of a carriage mounted flexible printhead interconnect circuit with printhead control signal de-multiplexers and a connected trailing cable.

FIG. 4 is a rear perspective view of the interconnect circuit of FIG. 3.

DESCRIPTION OF THE PREFERRED EMBODIMENT

Figure 1:
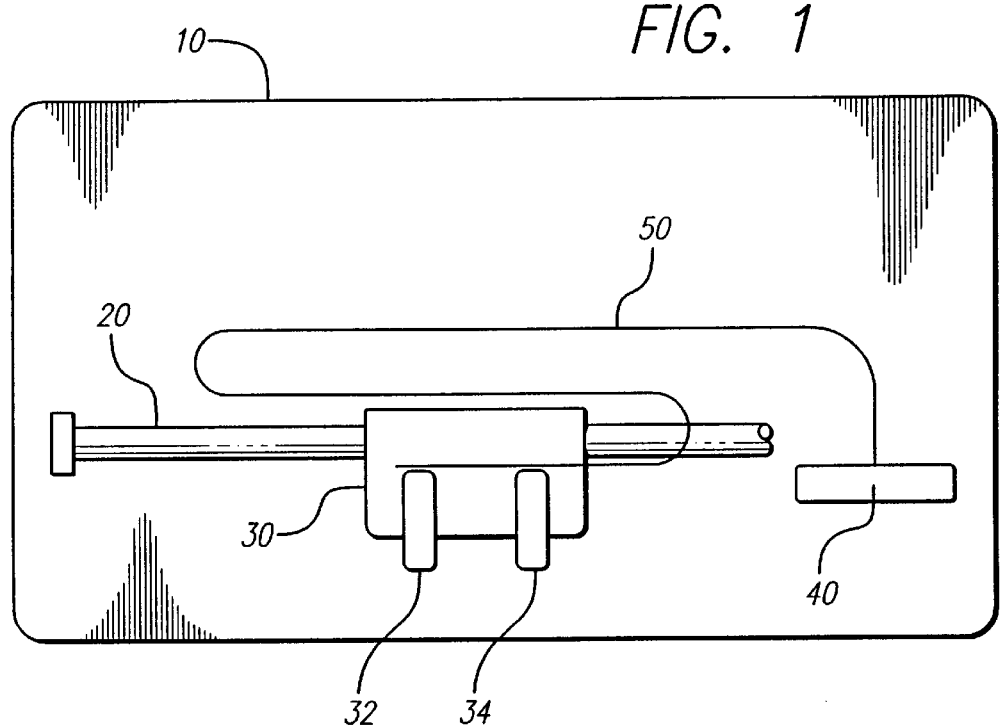
FIG. 1 is a schematic plan view of an inkjet printer carriage and flexible electric trailing cable.

The schematic plan view of FIG. 1 shows a desk top inkjet printer 10 having a transversely extending carriage support rod or rods 20 on which a carriage 30 is mounted for back and forth movement transversely of the printer 10. One or more removable printheads 32, 34 are mounted on the carriage 30 and eject ink downwardly onto the media on which printing is to take place. A flexible multi-conductor trailing cable 50 is used to conduct electrical printhead control signals from a stationary location on the printer such as a printed circuit board 40. The control signals are transmitted as multiplexed signals to minimize the numbers of conductors required for the trailing cable 50.

Figure 2A:
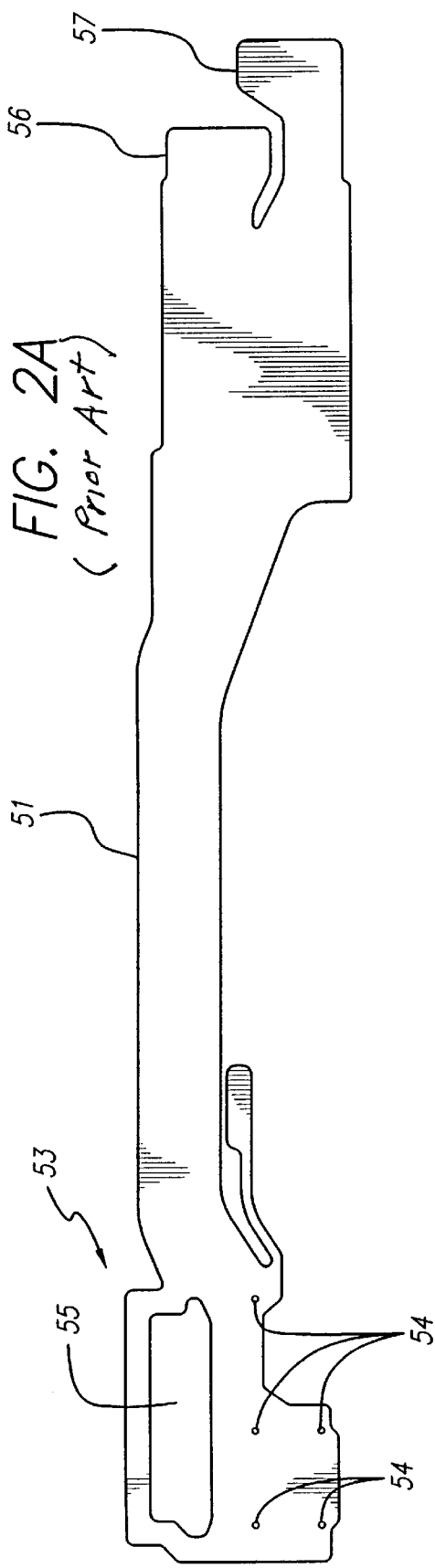
FIGS. 2a and 2b are flat layouts of the separate layers of a prior art carriage trailing cable which are then superimposed for transmitting de-multiplexed printhead control signals to a printhead carriage.
Figure 2B:
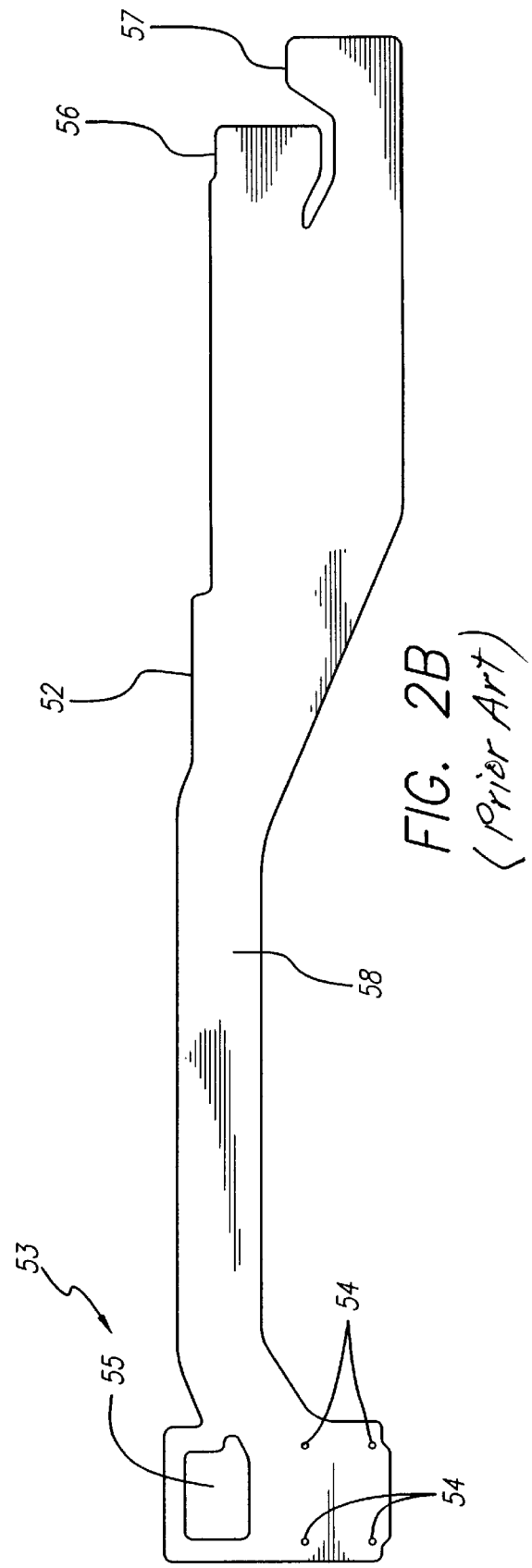

FIGS. 2a and 2b show the layout of one trailing cable presently used by the assignee of the present invention discussed in the above Background of the Invention. The cable comprises a back layer 51 (FIG. 2a) for connection to a black ink printhead and a top layer 52 (FIG. 2b) for connecting to a color inkjet printhead, each layer having 60 conductors, the layers being separately manufactured and then layer 51 and layer 52 are superimposed when installed in a printer. Each layer has a carriage end section 53 with carriage mounting pin receiving holes 54 and an aperture 55 for receiving printhead connecting latches. The aperture in the back layer 51 is large enough to receive two printhead connecting latches and the aperture of the front layer 52 is sized to receive one latch. The superimposed back and top layers of the cable each have a connector end at the right as seen in FIG. 2 which is split into two spaced connector portions 56, 57 each comprising 30 conductors. The trailing length portion 58 of the cable layers is being substantially narrower (in the vertical direction as seen in FIGS. 2a and 2b) than the carriage connection end 53 and the spaced PCB connecting end portions 56, 57.

Figure 5:
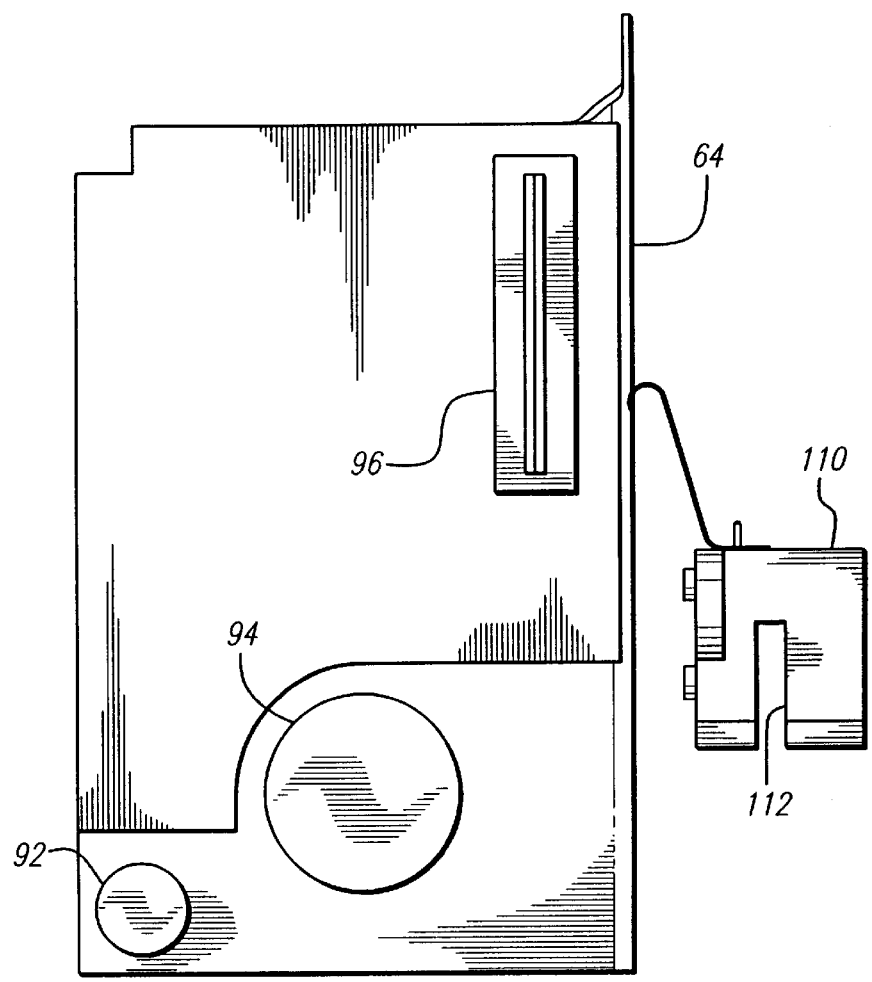
FIG. 5 is a right side elevation view of the interconnect circuit of FIG. 3.
Figure 6:
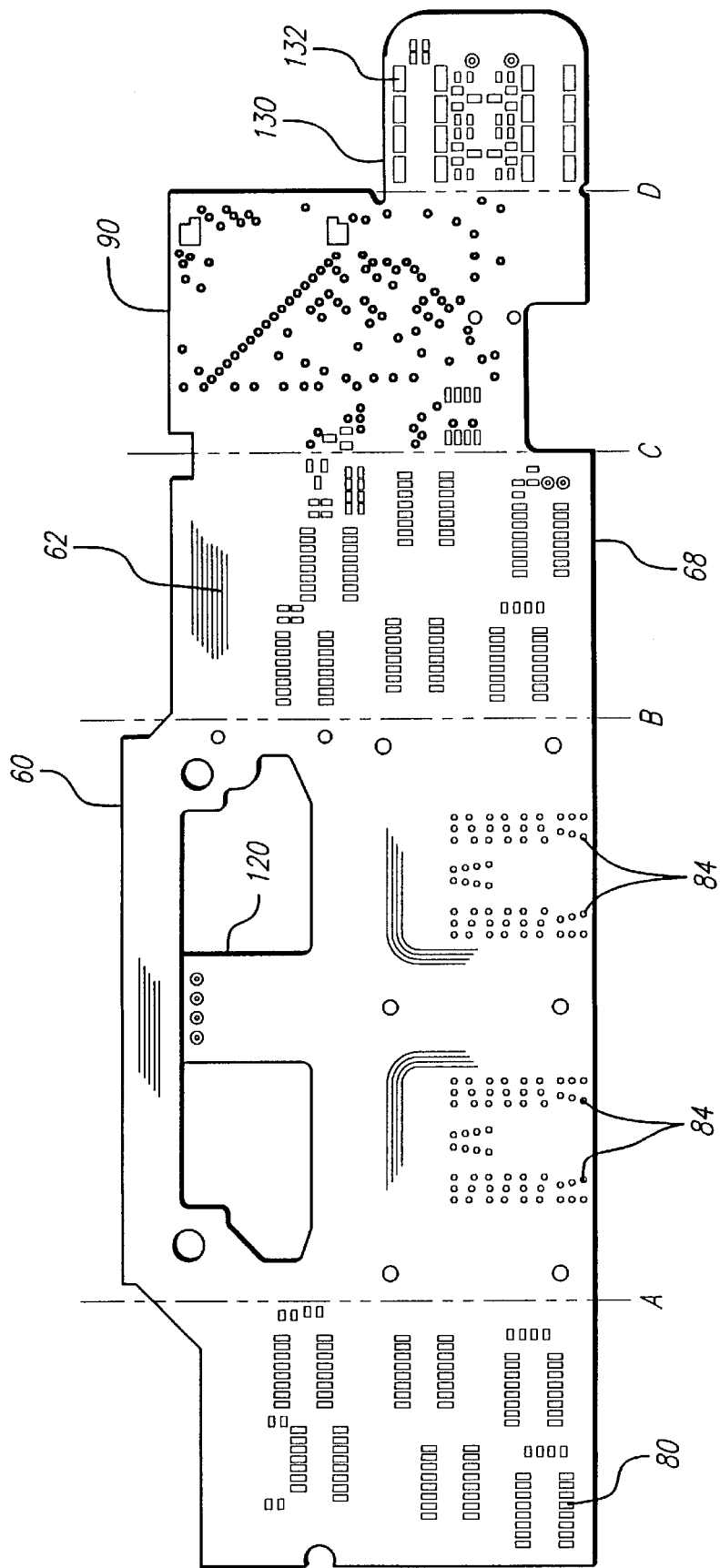
FIG. 6 is a layout plan view of the interconnect circuit of FIG. 3.

The carriage mounted flex circuit 60 of the present invention is shown in FIGS. 3–6 and comprises an insulating panel with multiple electrical conductors 62 embedded therein in a pattern seen in FIG. 6 designed to transmit electrical printhead control signals to the printheads. FIGS. 3 and 4 show the insulating panel and embedded conductors folded into a three-sided configuration which may be mounted on a relatively rigid printhead carriage having a back and side portions configured to provide structural support to the back 64 and wings 66, 68 of the flex circuit 60 to maintain the wings 66, 68 oriented at angles of approximately 90° with respect to the back 64. A plurality of mounting holes 70 are formed in the flex circuit to receive protruding positioning pins which extend from the relatively rigid carriage parts which hold the flex circuit back 64 and wings 66, 68 in their desired positions with respect to each other on the carriage.

As seen in FIG. 6, the flex circuit is laid out in a flat generally rectangular configuration which enables multiple flex circuits to be laid out in close proximity to each other so that they can be simultaneously fabricated from a single standard size rectangular layout with a minimum of waste.

The facing sides of the left and right wings 66, 68 each have a plurality of printhead control signal de-multiplexer circuit components 80 electrically connected to selected ones of the electrical conductors 62 in the insulating carrier. The electrical signals, having been de-multiplexed, are then transmitted through the conductors to exposed printhead contacts 84 (FIG. 6) on the inner surface of the back 64 arranged in two separate groups 86, 88 to be electrically engaged by patterns of identically arranged electrical contact pads on each of the printheads. The exposed contacts 84 are preferably gold plated dome configurations for sliding and pressure contact with gold contact pads on the printheads. The dome configured contact pads provide the compliance needed for a reliable contact.

Preferably, the right wing 68 includes an additional integrally formed panel (FIG. 6) so that wing 68 may be folded back on itself so that additional circuit components can be connected to the outside of the right wing 68 on panel 90 in electrical contact with selected conductors 62 in the flexible circuit. A cable connector 96, preferably having thirty conductors is also mounted in electrical contact with the electrical conductors 62 in the flex circuit on the outside of the panel 90 on the right wing 68 for sliding connection to a printhead trailing cable 50.

The back 64 of the flex circuit is provided with a horizontally elongated aperture 100 the purpose of which is to enable connection and disconnection of the printheads to the printhead carriage by latches on the carriage (not shown) which extend through the aperture 100 to connect the printheads.

As is known, an optical position reader or encoder 110 (FIG. 4) is mounted on the printhead carriage. As seen in FIG. 5, spacing between the encoder 110 and the back 64 is shown to indicate the area which receives the portion of the relatively rigid printhead carriage on which the encoder 110 is mounted. The optical position encoder 110 includes a vertically extending slot 112 through which an elongated optical position strip (not shown) passes during movement of the carriage relative to the encoder strip. The optical position encoder 110 is therefore able to optically read and thus determine the position of the carriage and printheads with respect to the printer chassis. Electrical connection to the optical position encoder 110 is made by formation of a vertically extending tab 120 on the flex circuit approximately at the lower middle of the aperture 100, the tab 120 containing the necessary electrical leads and contacts to electrically connect to the optical position encoder 110 to the flex circuit. Note the position of the tab 120 in the aperture 100 of the present invention in the layout view of FIG. 6 and compare with the layout view of the prior art in FIG. 2 where the optical encoder leads are laid out to extend parallel to the trailing cable. After the flex circuit is fabricated and during assembly of the flex circuit on the carriage, the tab 120 and attached encoder 110 is bent downwardly over the carriage with the conductors electrically connected to the optical position encoder 110 as shown.

Reference to FIG. 6 shows the location of the fold lines A, B, C, D and the generally rectangular configuration of the flex circuit before it is folded into its three sided configuration shown in FIGS. 3 and 4. Optionally, an additional foldable panel 130 which extends from the free edge of the folded back panel 90 of the right wing 68 may receive additional circuit components 132 electrically connected to selected conductors in the flex circuit. Panel 130 may be folded back on panel 90 adjacent the right wing 68 to thus cover the additional circuit components 132 on the panel 130 which would otherwise be exposed in absence of the fold over cover.

Persons skilled in the art will appreciate that the particular pattern of conductor traces shown in FIG. 6 is merely exemplary and that an infinite number of variations of trace patterns can be used without departing from the scope of the invention which is defined by the claims which follow.

What is claimed is:

1. A printhead de-multiplexing and interconnect carriage mounted flex circuit comprising:

a) a flexible multi-conductor carrying insulating panel foldable into a generally three sided configuration for attachment to a relatively rigid printhead carriage for demultiplexing and conducting multiplexed electrical control signals from a printhead trailing cable to removable printheads mounted on and moveable with the printhead carriage, some conductors in said panel terminating in printhead electrical contacts on a surface thereof for engagement with electrical contacts on said removable printheads;

b) a cable connecter on said panel in electrical contact with said conductors for connecting said flex circuit to a printhead trailing cable which extends to a remote location from which multiplexed printhead control signals are transmitted to said flex circuit; and c) one or more printhead control signal de-multiplexer components mounted on said flexible panel in electrical contact with at least some of said conductors and with said printhead electrical contacts.

2. The flex circuit of claim 1, wherein said flexible panel is foldable to form a back and two wings extending from the same side of said back, and de-multiplexer components being mounted on facing sides of said wings.

3. The flex circuit of claim 2, wherein said wings extend parallel to each other and extend from said back at angles of approximately 90° with respect to said back.

4. The flex circuit of claim 2, including a plurality of positioning holes on said back and said wings for receiving positioning pins on a printhead carriage having a rigid carriage back and carriage wings for respectively supporting said back and wings of said flex circuit.

5. The flex circuit of claim 1, wherein said flexible panel is foldable to form a back and two wings extending from the same side of said back, an aperture in said back for receiving printhead latches to fasten printheads to the carriage when printheads are mounted on the printer carriage, and further comprising an integrally formed tab on said panel, said tab having electrical conductors therein for connecting said flex circuit to an optical position encoder, said tab being foldable and extending from said aperture alongside and spaced from said back to said encoder.

6. The flex circuit of claim 1, further comprising an aperture in said back for receiving printhead latches to fasten printheads to the carriage when printheads are mounted on the printer carriage.

7. The flex circuit of claim 6, wherein said printhead contacts are located on said back between said wings.

8. The flex circuit of claim 7, wherein said printhead contacts have a dome configuration.

9. A printhead de-multiplexing and interconnect carriage mounted flex circuit comprising:
   a) a flexible multi-conductor carrying insulating panel foldable into a generally three sided configuration for attachment to a relatively rigid printhead carriage for demultiplexing and conducting multiplexed electrical control signals from a printhead trailing cable to removable printheads mounted on and moveable with the printhead carriage, some conductors in said panel terminating in printhead electrical contacts on a surface thereof for engagement with electrical contacts on said removable printheads;
   b) a cable connecter on said panel in electrical contact with said conductors for connecting said flex circuit to a printhead trailing cable which extends to a remote location from which multiplexed printhead control signals are transmitted to said flex circuit; and
   c) one or more printhead control signal de-multiplexer components mounted on said flexible panel in electrical contact with at least some of said conductors and with said printhead electrical contacts, said flexible panel being foldable to form a back and two wings extending from the same side of said back, and de-multiplexer components being mounted on facing sides of said wings, said wings extending parallel to each other and extending from said back at angles of approximately 90° with respect to said back and wherein one of said wings is folded back on itself, there being additional circuit components in electrical contact with some conductors of said circuit, said additional components being on said flex circuit on the side of said folded wing opposite said de-multiplexer components.

10. The flex circuit of claim 9, wherein said cable connector is mounted on said side of said wing with said additional circuit components.

11. The flex circuit of claim 10, wherein at least some of said additional components are capacitive components.

12. The flex circuit of claim 10, further comprising an aperture in said back for receiving printhead latches to fasten printheads to the carriage when printheads are mounted on the printer carriage.

13. The flex circuit of claim 12, wherein said printhead contacts are located on said back between said wings.

14. The flex circuit of claim 13, wherein said printhead contacts have a dome configuration.

* * * * *